United States Patent [19]
Mori et al.

[11] Patent Number: 5,270,567
[45] Date of Patent: Dec. 14, 1993

[54] THIN FILM TRANSISTORS WITHOUT CAPACITANCES BETWEEN ELECTRODES THEREOF

[75] Inventors: Hisatoshi Mori, Fussa; Nobuyuki Yamamura, Hanno, both of Japan

[73] Assignee: Casio Computer Co., Ltd., Tokyo, Japan

[21] Appl. No.: 845,771

[22] Filed: Mar. 3, 1992

Related U.S. Application Data

[63] Continuation of Ser. No. 574,657, Aug. 28, 1990, abandoned.

[30] Foreign Application Priority Data

Sep. 6, 1989 [JP] Japan .................. 1-229227

[51] Int. Cl.$^5$ .............................. H01L 49/02
[52] U.S. Cl. ........................ 257/412; 257/66
[58] Field of Search .......... 357/23.4, 4, 23.7; 257/61, 59, 66, 72, 412

[56] References Cited

U.S. PATENT DOCUMENTS

| | | | |
|---|---|---|---|
| 4,951,113 | 8/1990 | Huang et al. | 257/61 |
| 5,017,984 | 5/1991 | Tanaka et al. | 357/23.7 |
| 5,109,260 | 4/1992 | Tanaka et al. | 257/61 |

FOREIGN PATENT DOCUMENTS

| | | | |
|---|---|---|---|
| 53-26584 | 3/1978 | Japan | 357/23.7 |
| 56-15063 | 2/1981 | Japan | 357/23.7 |
| 58-28870 | 2/1983 | Japan | 357/4 |
| 60-117881 | 6/1985 | Japan | 357/23.7 |
| 61-105863 | 5/1986 | Japan | 357/4 |
| 61-156106 | 7/1986 | Japan | 350/334 |
| 62-15857 | 1/1987 | Japan | 357/4 |
| 62-213165 | 9/1987 | Japan | 357/4 |
| 63-131569 | 6/1988 | Japan | 357/4 |
| 1-91467 | 4/1989 | Japan | 357/23.7 |

Primary Examiner—Martin Lerner
Assistant Examiner—Hung Dang
Attorney, Agent, or Firm—Frishauf, Holtz, Goodman & Woodward

[57] ABSTRACT

In this film transistor used for a liquid crystal display element, etc., the source and drain electrodes are formed at positions which do not overlap the gate electrode. Capacitances between the gate and source electrodes and between the gate and drain electrodes can be almost eliminated.

5 Claims, 6 Drawing Sheets

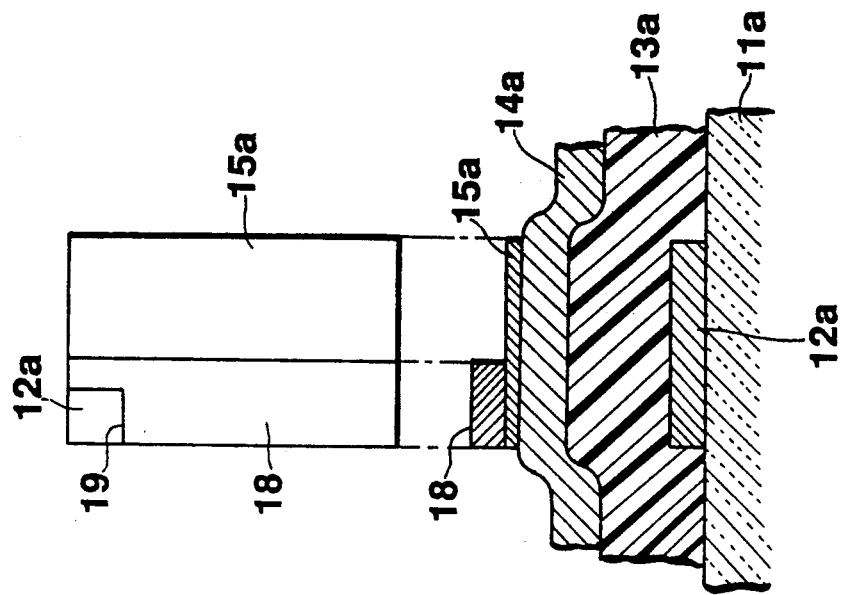
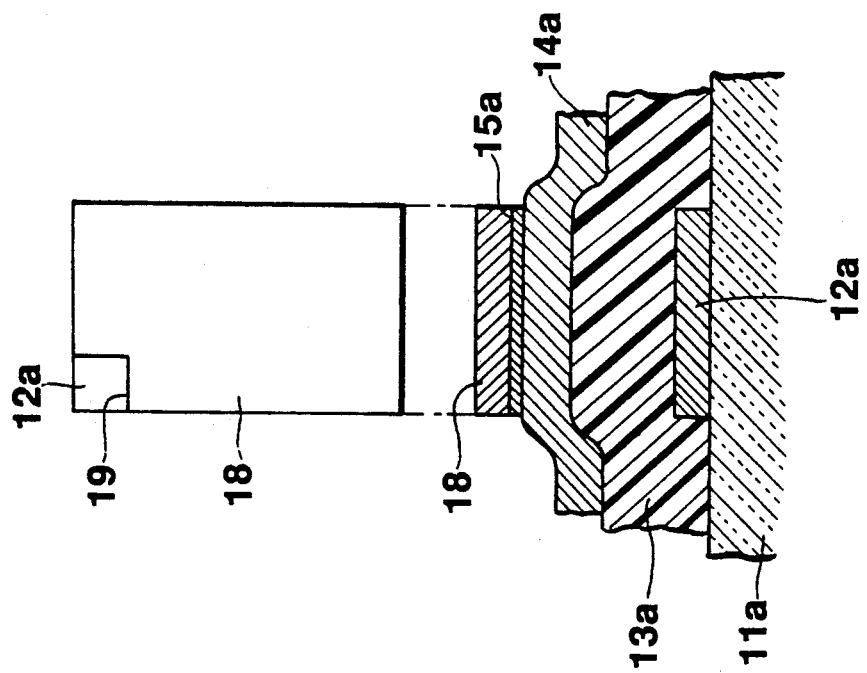

THIN FILM TRANSISTORS WITHOUT CAPACITANCES BETWEEN ELECTRODES THEREOF

This application is a Continuation of application Ser. No. 07/574,657 filed on Aug. 28, 1990 now abandoned.

BACKGROUND OF THE INVENTION

1. Field of the Invention

The present invention relates to a thin film transistor and, more particularly, to a thin film transistor which is improved not to have capacitances between a gate electrode and source and drain electrodes.

2. Description of the Related Art

Thin film transistors (TFTS) include inverted-stagger, stagger, inverted-coplanar, coplanar transistors.

FIG. 1 shows a conventional thin film transistor, and, in this case, inverted-stagger transistor. In FIG. 1, reference numeral 1 denotes a substrate made of glass or the like, and a gate electrode 2 made of a metal such as Cr is formed on the substrate 1. Reference numeral 3 denotes a gate insulating film made of SiN or the like formed on the gate electrode 2 throughout the entire surface of the substrate 1, and reference numeral 4 denotes an i-type a-Si semiconductor layer formed on the gate insulating film 3. The i-type semiconductor layer 4 is opposite to the gate electrode 2 through the gate insulating film 3. Reference numeral 5 denotes $n^+$-type a-Si semiconductor layers formed on the i-type semiconductor layer 4, and the n-type semiconductor layers 5 are formed to vertically oppose the gate electrode 2 and separated from each other on a channel portion. Reference numerals 6 and 7 denote source and drain electrodes made of a metal such as Cr and formed on the n-type semiconductor layers 5. The source and drain electrodes 6 and 7 are formed to have the same pattern as those of the n-type semiconductor layers 5 and connected to the i-type semiconductor layer 4 through the n-type semiconductor layers 5. Note that this thin film transistor is used as a pixel electrode selection switching element of a TFT active matrix liquid crystal display element. When the thin film transistor is employed to the TFT active matrix liquid crystal display element, the gate electrode 2 of the thin film transistor is connected to a gate line (scanning line), and the drain and source electrodes 7 and 6 are connected to a data line and a pixel electrode, respectively.

In the above thin film transistor, however, since the source and drain electrode 6 and 7 are vertically opposite to the gate electrode 2 through the n-type and i-type semiconductor layers 5 and 4 and the gate insulating film 3, respectively, large capacitances $C_{GS}$ and $C_{GD}$ are generated between the gate electrode 2 and the source electrode 6 and between the gate electrode 2 and the drain electrode 7.

For this reason, when the thin film transistor is used as, e.g., a pixel electrode selection switching element of a TFT active matrix liquid crystal display element, a voltage is applied from the data line to the pixel electrode when the thin transistor is turned on upon application of a gate voltage. When the thin film transistor is turned off, this voltage is immediately distributed in accordance with a rate of the gate-source capacitance ($C_{GS}$) to the liquid crystal capacitance ($C_{LC}$). For this reason, since the voltage at the pixel electrode is decreased lower than the data voltage, display characteristics during a one-frame period until the next pixel electrode is selected are degraded.

SUMMARY OF THE INVENTION

The present invention has been made in consideration of the above problem, and has as its object to provide a thin film transistor having almost no capacitances between a gate electrode and a source electrodes and between the gate electrode and a drain electrode.

In order to achieve the above object, according to the present invention, there is a thin film transistor comprising a gate electrode, a gate insulating film, an i-type semiconductor layer, an n-type semiconductor layer, a source electrode, and a drain electrode, wherein the source and drain electrodes are formed at positions which do not overlap the gate electrode. Using the above arrangement, capacitances between the gate and drain electrodes and between the gate and drain electrodes can be almost eliminated. In addition, characteristics of the thin film transistor can be confirmed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 and 6 are views showing a testing element for measuring frequency characteristics of the thin film transistor;

DETAILED DESCRIPTION OF THE PREFERRED EMBODIMENTS FIRST EMBODIMENT

The first embodiment of the present invention will be described below.

Figure 1:
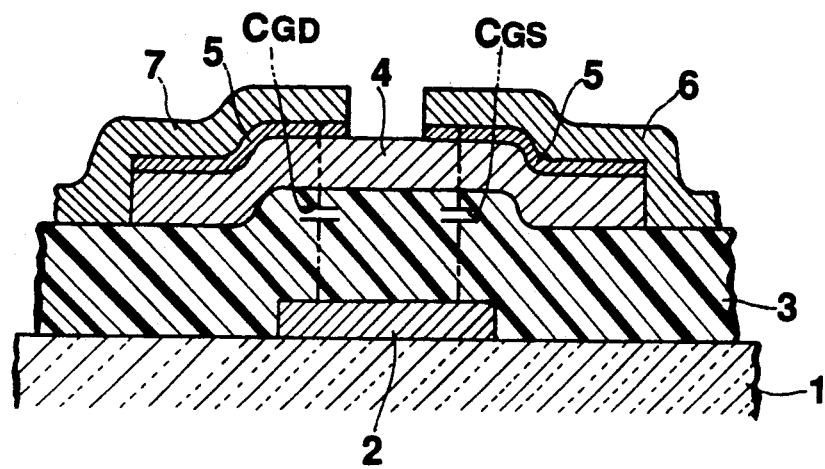
FIG. 1 is a sectional view showing a conventional thin film transistor.
Figure 2:
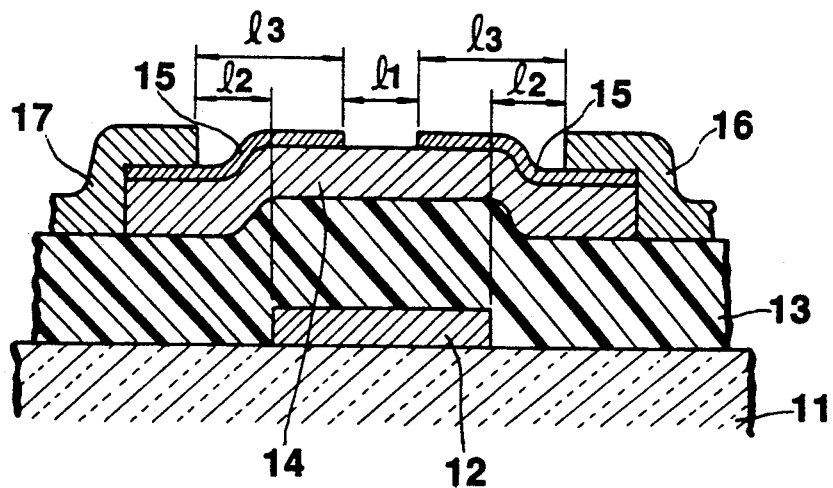
FIG. 2 is a sectional view showing a thin film transistor according to the first embodiment of the present invention.

FIG. 2 is a sectional view showing a thin film transistor according to this embodiment. Reference numeral 11 denotes a substrate made of glass or the like, and a gate electrode 12 made of a metal such as Cr is formed on the substrate 11. Reference numeral 13 denote a gate insulating film formed on the gate electrode 12 throughout the almost entire surface of the substrate 11, and reference numeral 14 denotes an i-type semiconductor layer made of amorphous silicon or polysilicon and formed on the gate insulating film 13. The i-type semiconductor layer 14 is opposite to the gate electrode 12 through the gate insulating film 13. Reference numerals 15 denote n-type semiconductor layers made of amorphous silicon or polysilicon and formed on the i-type semiconductor layer 14, and the n-type semiconductor layers 15 are formed to vertically oppose the gate electrode 12 and separated from each other on a channel portion. Reference numerals 16 and 17 respectively denote source and drain electrodes made of a metal such as Cr formed on the n-type semiconductor layer 15. The source and drain electrodes 16 and 17 are formed at positions which do not vertically overlap the gate electrode 12. The source and drain electrodes 16 and 17 are connected to the i-type semiconductor layer 14 through the n-type semiconductor layers 15. In this embodiment, a length $l_1$ of an isolated portion (channel portion) of the n-type semiconductor is set to be 5 $\mu$m, a horizontal interval 2 between the source or drain electrode 16 or 17 is set to be 5 $\mu$m, and a length $l_3$ of the extended portion of the n-type semiconductor layer 15 from the source or drain electrode 16 or 17 is set to be 9 $\mu$m.

Figure 3:
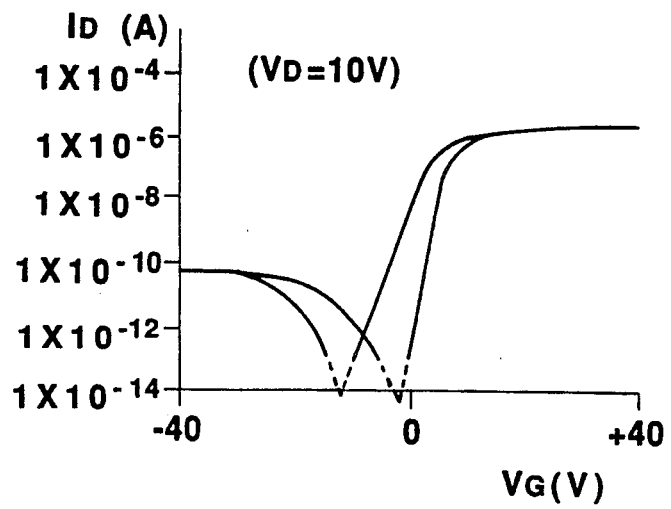
FIG. 3 is a graph showing $V_G$-$I_D$ characteristic curves of the thin film transistor in FIG. 2.
Figure 4:
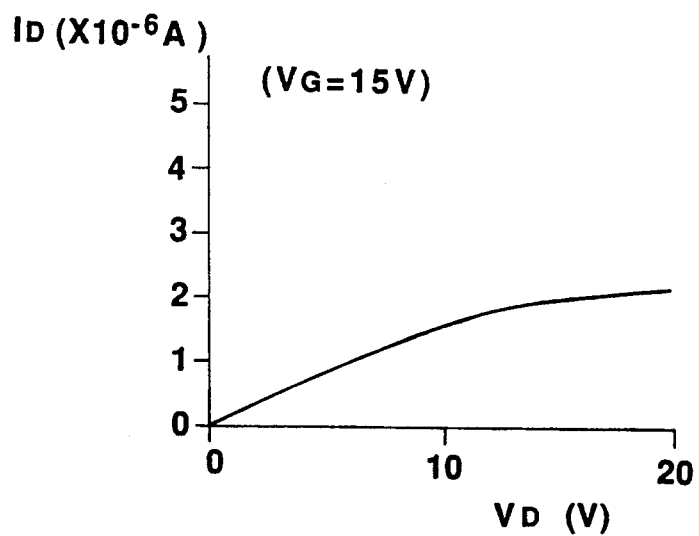
FIG. 4 is a graph showing a $V_D$-$I_D$ characteristic curve of the thin film transistor in FIG. 2

FIGS. 3 and 4 show static characteristics of the thin film transistor, wherein FIG. 3 shows $V_G$ (gate voltage)—$I_D$ (drain current) characteristics when $V_D$ (drain voltage) $=10$ V, and FIG. 4 shows $V_D$—$I_D$ characteristics when VG=15V.

In the thin film transistor, since the source and drain electrodes 16 and 17 are formed at positions which do not vertically overlap the gate electrode 12, capacitances at high-frequency regions between the gate electrode 12 and the source electrode 16 and between the gate electrode 12 and the drain electrode 17 can be almost eliminated.

Figure 7:
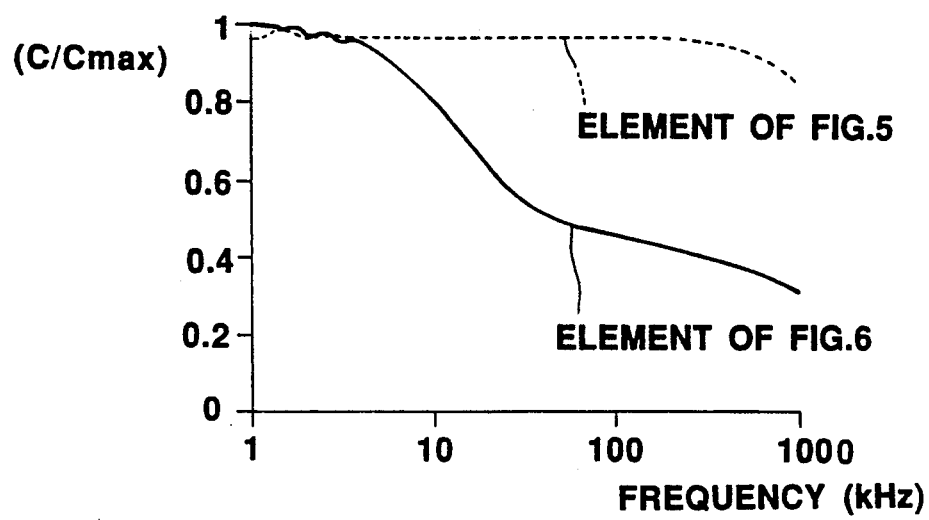
FIG. 7 is a graph showing frequency characteristics of the testing element in FIGS. 5 and 6.

FIG. 7 shows a result obtained by measuring the two types of testing elements shown in FIGS. 5 and 6, wherein the abscissa indicates frequencies (kHz), and the ordinate indicates a rate (C/Cmax) of a measuring capacitance (C) corresponding to each frequency to a maximum capacitance (Cmax obtained by changing frequencies. Each of the testing elements is formed by the following manner. A lower metal film 12a is formed on a glass substrate 11a, and an insulating film 13a made of SiN and an i-type semiconductor layer 14a made of amorphous silicon or polysilicon are stacked thereon. An n-type semiconductor layer 15a made of amorphous silicon or polysilicon is formed on the i-type semiconductor layer 14a to have the same pattern as the lower metal film 12a, and an upper metal film 18 is formed on the n-type semiconductor layer 15a. The testing element in FIG. 5 is obtained by forming the upper metal film 18 to have an area ($3.6 \times 10^{-3}$ cm$^2$) which is almost equal to that of the lower metal film 12a, and the testing element in FIG. 6 is obtained by forming the upper metal film 18 to have a ⅓ area of the lower metal film 12a. Note that, in FIGS. 5 and 6, reference numeral 19 denotes an opening which is formed in a part of the stacked film from the upper metal film 18 to the insulating film 13a and which is formed for applying a voltage to the lower metal film 12a.

When the frequency characteristics of the two types of testing elements are measured by applying a testing voltage of 35 V to the lower metal film 12a, the frequency characteristics of the testing element in FIG. 5 obtained by forming the upper metal film 18 to have an area which is almost equal to that of the lower metal film 12a has characteristics indicated by a broken line in FIG. 7, and the testing element in FIG. 5 has a maximum capacitance of about 65 pF. The frequency characteristics of the testing element in FIG. 6 obtained by forming the upper metal film 18 to have a ⅓ area of the lower metal film 12a are characteristics indicated by a solid line in FIG. 7. The testing element in FIG. 6 has a maximum capacitance of 63 pF which is equal to that of the testing element in FIG. 5 in a low frequency region (1.0 kHz), but the testing element has a maximum capacitance of 19 pF (C/Cmax=0.3) in a high-frequency region (1.0 MHz). The testing element in FIG. 6 has a capacitance almost equal to that of the testing element in FIG. 5 in the low-frequency region, since the n-type semiconductor layer 15a formed on the i-type semiconductor layer 14a to have the same pattern as that of the lower metal film 12a serves as an electrode in the low-frequency region. A region constituted by a single layer of the n-type semiconductor layer 15a does not have a capacitance in the low-frequency region.

That is, the capacitances between the gate and source electrodes 12 and 16 and between the gate and drain electrodes 12 and 17 depend on a portion where the drain and gate electrodes 16 and 17 overlap the gate electrode 12. As the thin film transistor of the first embodiment, when the source and drain electrodes 16 and 17 are formed at a positions which do not vertically overlap the gate electrode 12, capacitances between the gate and source electrodes 12 and 16 and between the gate and drain electrodes 12 and 17 in the high-frequency region are lower than those characteristics indicated by the solid line in FIG. 7.

In addition, in the thin film transistor according to the first embodiment, the n-type semiconductor layers 15 for connecting the gate electrode 12 to the source and drain electrodes 16 and 17 are formed to vertically oppose the gate electrode 12, and the source and drain electrodes 16 and 17 are connected to the i-type semiconductor layer 14 through the n-type semiconductor layers 15. Therefore, as described above, the n-type semiconductor layers 15 serve as source and drain electrodes to obtain satisfactory transistor characteristics.

Figure 8:
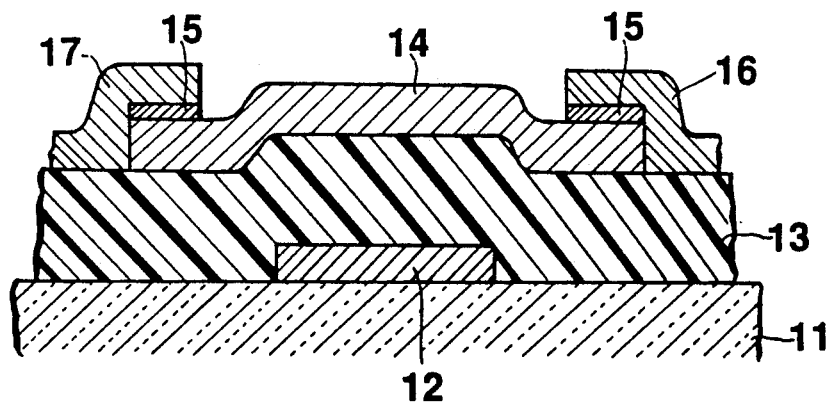
FIG. 8 is a sectional view showing a thin film transistor formed such that source and drain electrodes and an n-type semiconductor layer do not vertically overlap a gate electrode.

That is, in order to eliminate the capacitances between the gate and source electrodes 12 and 16 and between the gate and drain electrodes 12 and 17, as in the thin film transistor shown in FIG. 8, the source and drain electrodes 16 and 17 and the n-type semiconductor layers 15 may be formed at the positions which do not vertically overlap the gate electrode 12. However, when a gate voltage is applied to the gate electrode 12, the thin film transistor is not operated, and any ON current ($I_{ON}$) does not flow. For this reason, in the thin film transistor of the above embodiment, the n-type semiconductor layers 15 for connecting the gate electrode 12 to the source and drain electrodes 16 and 17 are formed to vertically oppose the gate electrode 12, and only the source and drain electrodes 16 and 17 are formed at positions which do not vertically overlap the gate electrode 12. In this manner, as shown in FIGS. 3 and 4, since the drain current ID of about 1.5 μA flows when the drain voltage $V_D = 10$ V and the gate voltage $V_G = 15$ V, satisfactory transistor characteristics can be obtained.

In a thin film transistor used as, e.g., a pixel electrode selection switching element of a TFT active matrix liquid crystal display element, a gate ON time required for the ON current $I_{ON}$ is about 60 μsec, which corresponds to a frequency of 17 kHz, and a fall time of a gate pulse which adversely affects the gate-source capacitance ($C_{GS}$) is about 60 μsec, which corresponds to a frequency of 20 MHz. As in the thin film transistor of the first embodiment, when a portion where the source and drain electrodes are opposite to the gate electrode 12 is formed by only the n-type semiconductor layers 15, the n-type semiconductor layers 15 serve as source and drain electrodes in the gate ON time (17 kHz) to flow the ON current ($I_{ON}$). Since the n-type semiconductor layer 15 has a gate-source capacitance ($C_{GS}$) in the fall time (20 MHz), when the thin film transistor is turned off, the pixel electrode voltage is not distributed at a rate of the gate-source capacitance ($C_{GS}$) to a liquid crystal capacitance ($C_{LC}$). Therefore, a display state can be continued during a one-frame period until the next pixel electrode is selected.

The inverted-stagger thin film transistor has been described in the above first embodiment, but the present invention can be applied to stagger, inverted-coplanar, and coplanar thin transistors. In addition, the present invention can be applied to not only a thin film transistor used as a pixel electrode selection switching element of a TFT active matrix liquid crystal display element, but a thin film transistor used in other applications.

Second Embodiment

Figure 9:
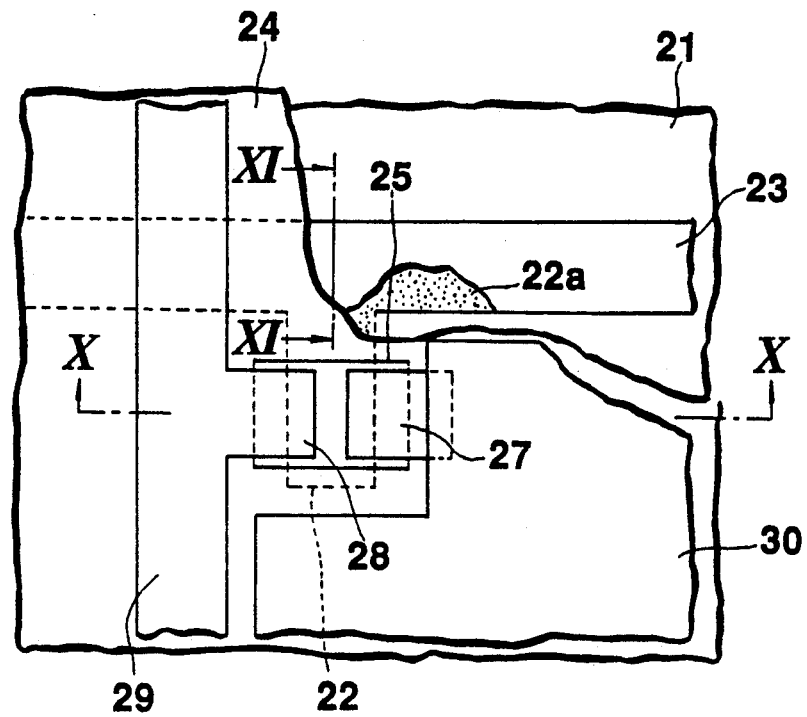
FIG. 9 is a plan view showing a thin film transistor according to the second embodiment of the present invention.
Figure 10:
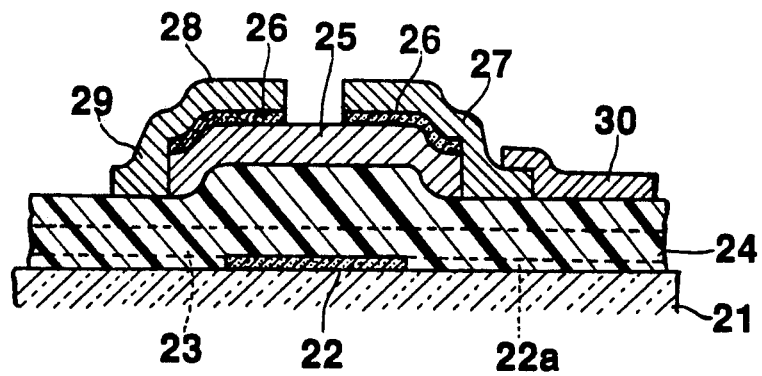
FIGS. 10 and 11 are enlarged sectional views showing the thin film transistor taken along lines X—X and XI—XI in FIG. 9.
Figure 11:
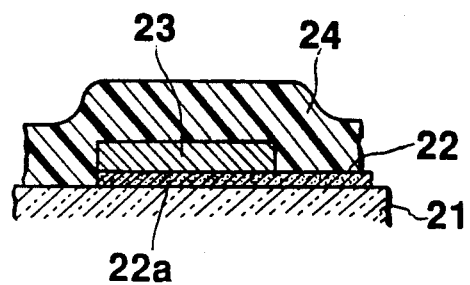

The second embodiment of the present invention will be described below. FIGS. 9 to 11 show a thin film transistor of a TFT panel used in a TFT active matrix liquid crystal display element according to the second embodiment of the present invention.

Referring to FIGS. 9 to 11, reference numeral 21 denotes an insulating transparent substrate made of glass, reference numeral 22 denotes a gate electrode formed on the substrate 21, and reference numeral 23 denotes a gate line (scanning line) wired on the substrate 21 and made of a metal such as chromium. The gate electrode 22 is connected to the gate line 23. The gate electrode 22 is formed by an n-type semiconductor layer made of amorphous silicon or polysilicon. The gate electrode 22 and the gate line 23 constituted by the n-type semiconductor layer are formed as follows. An n-type semiconductor and a metal such as chromium are sequentially deposited on the substrate 21, the metal film is patterned to have a shape of the gate line 23, and then the deposited n-type semiconductor film is patterned to have a shape of the gate electrode 22. The deposited n-type semiconductor film is linearly left under the gate line 23 throughout the entire length of the gate line 23, and the gate electrode 22 is connected to the gate line 23 at a line portion 22a under the gate line 23. Note that the thickness of the n-type semiconductor layer serving as the gate electrode 22 is about 250 Å, and the thickness of the gate line 23 is about 1,000 Å.

Reference numeral 24 denotes a transparent gate insulating film formed on the entire surface of the substrate 21 on the gate electrode 22 and the gate line 23 and made of silicon nitride (SiN). An i-type semiconductor layer 25 made of amorphous silicon or polysilicon is formed to oppose the gate electrode 22 on the gate insulating film 24. Reference numeral 26 denotes an n-type semiconductor layer formed on the i-type semiconductor layer 25 and made of amorphous silicon or polysilicon, and the n-type semiconductor layers 26 are isolated from each other on a channel portion. Reference numerals 27 and 28 denote source and drain electrodes made of a metal such as chromium. The source and drain electrodes 27 and 28 are formed on the n-type semiconductor layers 26 and connected to the i-type semiconductor layer 25 through the n-type semiconductor layers 26. An inverted-stagger thin film transistor is constituted by the gate electrode 27, the gate insulating film 24, the i-type semiconductor layer 25, the n-type semiconductor layers 26, and the source and drain electrodes 27 and 28. The drain electrode 28 is connected to a data line 29 wired perpendicularly to the gate line 23 on the gate insulating film 24. Reference numeral 30 denotes a pixel electrode constituted by a transparent conductive film such as ITO formed on the gate insulating film 24. The pixel electrode 30 is connected to the source electrode 27 such that a terminal of the pixel electrode 30 is formed to overlap the source electrode 27.

That is, in the thin film transistor of the second embodiment, the source and drain electrodes 27 and 28 are formed to vertically oppose the gate electrode 22, and the gate electrode 22 is made of an n-type semiconductor and connected to the gate line 23 made of a metal.

According to the thin film transistor of the second embodiment, since the gate electrode 22 is made of an n-type semiconductor, capacitances between the gate electrode 22 and the source electrode 27 and between the gate electrode 22 and the drain electrode 28 can be eliminated. That is, when the gate electrode 22 is made of an n-type semiconductor, the source and drain electrodes 27 and 28 are metal electrodes and capacitances are not formed between the gate electrode 22 and the source electrode 27 and between the gate electrode 22 and the drain electrode 28 even if the gate electrode 22 is vertically opposite to the source and drain electrodes 27 and 28. This is because one of the gate electrode 22 and the source or drain electrode 27 or 28 which interposes the gate insulating film 24, the i-type semiconductor layer 25, and the n-type semiconductor layer 26 with the gate electrode 22 comprises only an n-type semiconductor electrode. Therefore, as in the thin film transistor of the first embodiment, capacitances between the gate electrode 22 and the source electrode 27 and between the gate electrode 22 and the drain electrode 28 can be eliminated. According to this thin film transistor, the capacitances are not formed between the gate electrode 22 and the source electrode 27 and between the gate electrode 22 and the drain electrode 28. Unlike a conventional thin film transistor, when the thin film transistor is turned off, a voltage applied from the data line to the pixel electrode by turning on the thin film transistor upon application of the gate voltage is not immediately distributed at a rate of a gate-source capacitance to a liquid crystal capacitance. Therefore, since the pixel electrode voltage during a one-frame period until the next pixel electrode 30 is selected can be kept at a voltage almost equal to a data voltage applied during the selection, a display state during the one-frame period can be properly maintained, thereby improving display characteristics of a liquid crystal display element.

In addition, in the above thin film transistor of the second embodiment since metal electrodes are used as the source and drain electrodes 27 and 28 and the source and drain electrode 27 and 28 are vertically opposite to the gate electrode 22, an ON current larger than that of the thin film transistor of the first embodiment can be obtained.

In the thin film transistor of the second embodiment, only the gate electrode 22 is made of an n-type semiconductor and the gate line 23 connected to the gate electrode 22 is a metal line. Although the gate electrode 22 is made of an n-type semiconductor, the electric resistance of the gate line 23 can be decreased, and voltage drop across the gate line 23 can be reduced.

Note that, in the second embodiment, an n-type semiconductor layer serving as the gate electrode 22 is linearly formed throughout the entire length of the gate line 23, and the n-type semiconductor serving as the gate electrode 22 may be provided to only the transistor element portion. The gate electrode 22 may be formed such that a portion of the electrode 22 overlaps the gate line 23 to connect the gate line 23. In addition, an inverted-stagger thin film transistor has been described in the above second embodiment. The present invention can be applied to stagger, inverted-coplanar, and coplanar thin film transistors. The present invention can be widely applied to not only a thin film transistor of a TFT panel for a TFT active matrix liquid crystal display element, but thin firm transistors for various purposes such as a thin film transistor used as a memory element of a TFT memory array.

Third Embodiment

Figure 12:
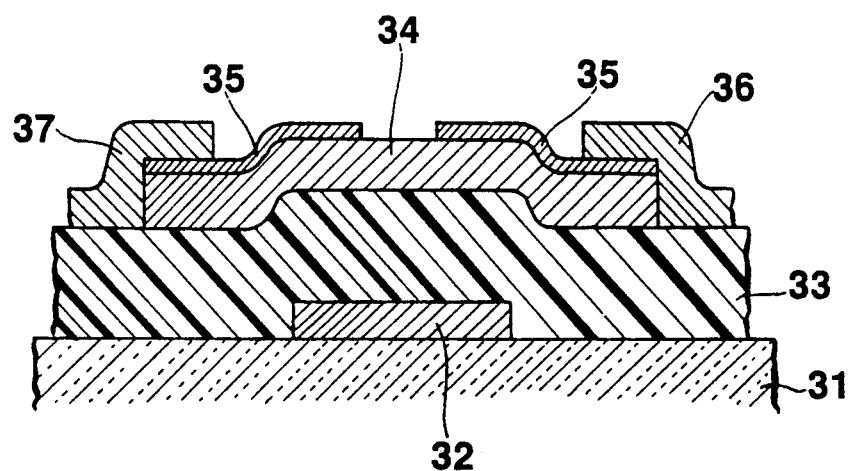
FIG. 12 is a sectional view showing a thin film transistor according to the third embodiment of the present invention.

The third embodiment of the present invention will be described below. FIG. 12 is a sectional view showing a thin film transistor according to the third embodiment of the present invention.

In the thin film transistor of the third embodiment, the n-type semiconductor layer described in the second embodiment is used as the gate electrode of the thin film transistor described in the first embodiment.

That is, as a substrate, a gate electrode 32 constituted by an n-type semiconductor layer made of amorphous silicon or polysilicon is formed. Reference numeral 33 denotes a gate insulating film made of SiN or the like and formed on the gate electrode 32 throughout the almost entire surface of the substrate 31, and reference numeral 34 denotes an i-type semiconductor layer which is opposite to the gate electrode 32 through the gate insulating film 33. Reference numerals 35 denote n-type semiconductor layers made of amorphous silicon or polysilicon and deposited on the i-type semiconductor layer 34, and the n-type semiconductor layers 35 are formed to vertically oppose the gate electrode 32 and isolated from each other on a channel portion. Reference numerals 36 and 37 denote source and drain electrodes made of a metal such as Cr and formed on the n-type semiconductor layers 35. The source and drain electrodes 36 and 37 ar formed at positions which do not vertically overlap the gate electrode 32, and the source and drain electrodes are connected to the i-type semiconductor layer 34 through the n-type semiconductor layers 35.

As described above, according to this embodiment, as in the first embodiment, capacitances between the gate and source electrodes and between the gate and drain electrodes can be almost eliminated, and satisfactory thin film transistor characteristics can be properly obtained.

Although an inverted-stagger thin film transistor has been described in the third embodiment, this embodiment can be applied to stagger, inverted-coplanar, and coplanar thin film transistors.

In addition, this embodiment can be applied to not only a thin film transistor used as a pixel electrode selection switching element of a TFT active matrix liquid crystal display element, but a thin film transistor used for other purposes.

As described above, according to the present invention, since the source and drain electrodes are formed at positions which do not overlap the gate electrode, capacitances between the gate and source electrodes and between the gate and drain electrodes can be almost eliminated. In addition, satisfactory thin film transistor characteristics can be properly obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thin film transistor comprising:
   an I-type semiconductor;
   a gate electrode facing said I-type semiconductor with a gate insulating film therebetween;
   a pair of n-type semiconductor layers formed on a surface of said I-type semiconductor, said n-type semiconductor layers being separated from each other so as to form a channel portion in said I-type semiconductor, such that said n-type semiconductor layers partially overlap said gate electrode, each of said n-type semiconductor layers having a first portion, overlapping said gate electrode, and a second portion, which does not overlap said gate electrode; and
   source and drain electrodes partially formed on the second portions of said n-type semiconductor layers, such that said source and drain electrodes do not overlap said gate electrode.

2. A thin film transistor according to claim 1, wherein said source and drain electrodes are situated outside of outer edges of said gate electrode.

3. A thin film transistor according to claim 1, wherein said gate electrode is formed only on an n-type semiconductor layer.

4. A thin film transistor according to claim 1, wherein each of said I-type semiconductor and said n-type semiconductor layers is formed of a thin film semiconductor of amorphous silicon.

5. A thin film transistor according to claim 1, wherein each of said I-type semiconductor and said n-type semiconductor layers is formed of a thin film semiconductor of polysilicon.

* * * * *